United States Patent
Du et al.

(10) Patent No.: US 12,107,107 B2
(45) Date of Patent: Oct. 1, 2024

(54) DARK-CURRENT INHIBITING IMAGE SENSOR AND METHOD

(71) Applicant: OmniVision Technologies, Inc., Santa Clara, CA (US)

(72) Inventors: Yifei Du, San Jose, CA (US); Zhiqiang Lin, Fremont, CA (US); Hui Zang, San Jose, CA (US); Seong Yeol Mun, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 470 days.

(21) Appl. No.: 17/530,296

(22) Filed: Nov. 18, 2021

(65) Prior Publication Data

US 2023/0154960 A1     May 18, 2023

(51) Int. Cl.
    *H01L 27/14*         (2006.01)
    *H01L 27/146*       (2006.01)

(52) U.S. Cl.
CPC .. *H01L 27/14632* (2013.01); *H01L 27/14621* (2013.01); *H01L 27/14627* (2013.01); *H01L 27/14645* (2013.01)

(58) Field of Classification Search
CPC ......... H01L 27/14632; H01L 27/14621; H01L 27/14627; H01L 27/14645; H01L 27/1461; H01L 27/1463; H01L 27/1464; H01L 27/14643; H01L 27/14689
See application file for complete search history.

(56) References Cited

U.S. PATENT DOCUMENTS

| | | | |
|---|---|---|---|
| 7,855,407 B2 | 12/2010 | Shim | |
| 9,160,949 B2 | 10/2015 | Zhang et al. | |
| 2005/0062118 A1* | 3/2005 | Yaung | H01L 27/14643 |
| | | | 257/428 |
| 2015/0123229 A1* | 5/2015 | Momono | H01L 27/14645 |
| | | | 257/432 |
| 2015/0171243 A1* | 6/2015 | Lee | H01L 27/14632 |
| | | | 257/292 |
| 2018/0090536 A1* | 3/2018 | Mandai | H01L 27/14643 |
| 2020/0098798 A1* | 3/2020 | Takahashi | H01L 27/1461 |
| 2021/0225924 A1 | 7/2021 | Mun | |
| 2021/0225927 A1 | 7/2021 | Mun | |
| 2022/0077204 A1* | 3/2022 | Lee | H01L 27/14689 |
| 2022/0320160 A1* | 10/2022 | Liu | H01L 27/1463 |
| 2022/0344383 A1* | 10/2022 | Kao | H01L 27/14627 |
| 2024/0079427 A1* | 3/2024 | Fukuhara | H01L 27/14621 |

\* cited by examiner

*Primary Examiner* — S M Sohel Imtiaz
(74) *Attorney, Agent, or Firm* — COZEN O'CONNOR (57) ABSTRACT

A dark-current-inhibiting image sensor includes a semiconductor substrate, a thin and a thin junction. The semiconductor substrate includes a front surface, a back surface opposite the front surface, a photodiode, and a concave surface between the front surface and the back surface. The concave surface extends from the back surface toward the front surface, and defines a trench that surrounds the photodiode in a cross-sectional plane parallel to the back surface. The thin junction extends from the concave surface into the semiconductor substrate, and is a region of the semiconductor substrate. The semiconductor substrate includes a first substrate region, located between the thin junction and the photodiode, that has a first conductive type. The photodiode and the thin junction have a second conductive type opposite the first conductive type.

20 Claims, 5 Drawing Sheets

DARK-CURRENT INHIBITING IMAGE SENSOR AND METHOD

BACKGROUND

Camera modules in commercial products such as stand-alone digital cameras, mobile devices, automotive components, and medical devices include an image sensor. One type of image sensor is a complementary metal-oxide-semiconductor (CMOS) image sensor, which includes a semiconductor substrate that has a pixel array formed therein. Images produced by CMOS image sensors may include artifacts, some of which are caused by one or both of electrical cross-talk and optical cross-talk between adjacent pixels of the pixel array. Measures to reduce such cross-stalk can result in introducing other image artifacts.

SUMMARY OF THE EMBODIMENTS

In some CMOS image sensors, each pixel is optically and electrically isolated from neighboring pixels by a deep trench isolation (DTI) structure formed in a trench that both surrounds the photodiode of the pixel and includes a plurality of DTI trenches formed in a surface of the semiconductor substrate. Each DTI trench surrounds a respective photodiode of a pixel. The inventors have found that, for backside illuminated (BSI) image sensors, processes used to form the DTI trenches result in generation of excess charge carriers at trench surfaces, which increases dark current associated with the respective pixel. For example, plasma etching causes defects by damaging the semiconductor lattice. The increased dark current results in "white pixel" defects, in which a pixel outputs a large signal regardless of illumination thereon. The white pixel defects degrade image quality.

In a first aspect, a dark-current-inhibiting image sensor is disclosed. The image sensor includes a semiconductor substrate, a thin and a thin junction. The semiconductor substrate includes a front surface, a back surface opposite the front surface, a photodiode, and a concave surface between the front surface and the back surface. The concave surface extends from the back surface toward the front surface, and defines a trench that surrounds the photodiode in a cross-sectional plane parallel to the back surface. The thin junction extends from the concave surface into the semiconductor substrate, and is a region of the semiconductor substrate. The semiconductor substrate includes a first substrate region, located between the thin junction and the photodiode, that has a first conductive type. The photodiode and the thin junction have a second conductive type opposite the first conductive type.

In a second aspect, a method for inhibiting dark current in an image sensor is disclosed. The method includes electrically connecting a thin junction to a bias voltage. The thin junction is formed along a concave surface of a semiconductor substrate of the image sensor. The concave surface forms a trench surrounding a photodiode of the semiconductor substrate. The thin junction and a region of the semiconductor substrate adjacent thereto have opposite conductive types.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, indium gallium arsenide, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

Figure 1:
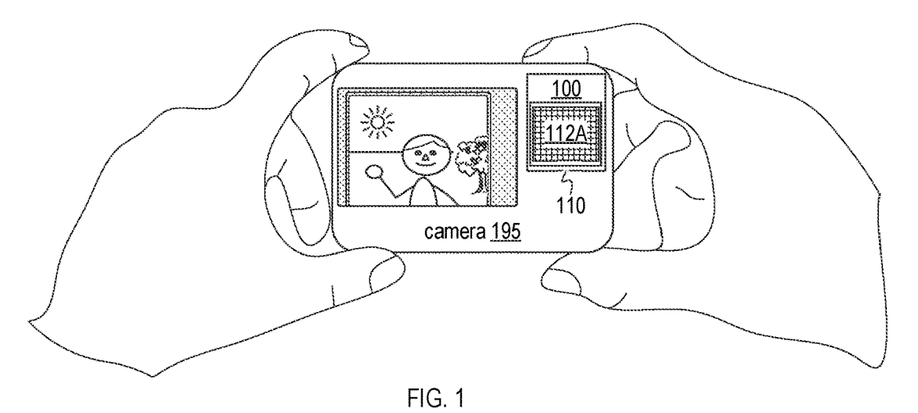
FIG. 1 depicts a camera imaging a scene; the camera includes an image sensor.

FIG. 1 depicts a camera 195 imaging a scene. Camera 195 includes an image sensor 100, which includes a semiconductor substrate 110. Constituent elements of semiconductor substrate 110 may include at least one of silicon and germanium. Semiconductor substrate 110 includes a pixel array 112A. Image sensor 100 may be part of a chip-scale package or a chip-on-board package. Camera 195 is shown as a component of a handheld device, but it should be appreciated that other devices, such as security devices, automobile cameras, drone cameras, etc. may utilize camera 195 without departing from the scope hereof.

Figure 2:
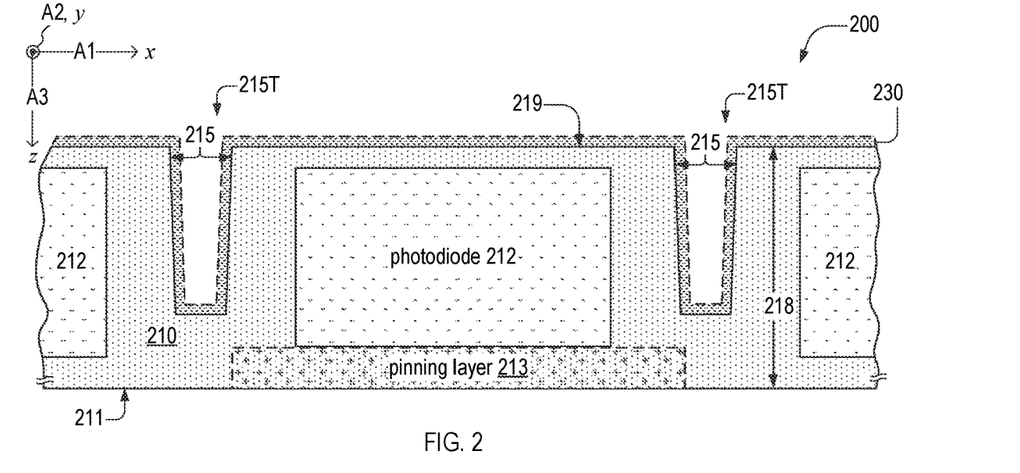
FIG. 2 is a cross-sectional schematic of an image sensor, which is an example of the image sensor of FIG. 1.

FIG. 2 is a cross-sectional schematic of an image sensor 200, which is an example of image sensor 100. The cross-section illustrated in FIG. 2 is parallel to a plane, hereinafter the x-z plane, formed by orthogonal axes A1 and A3, which are each orthogonal to an axis A2.

Figure 3:
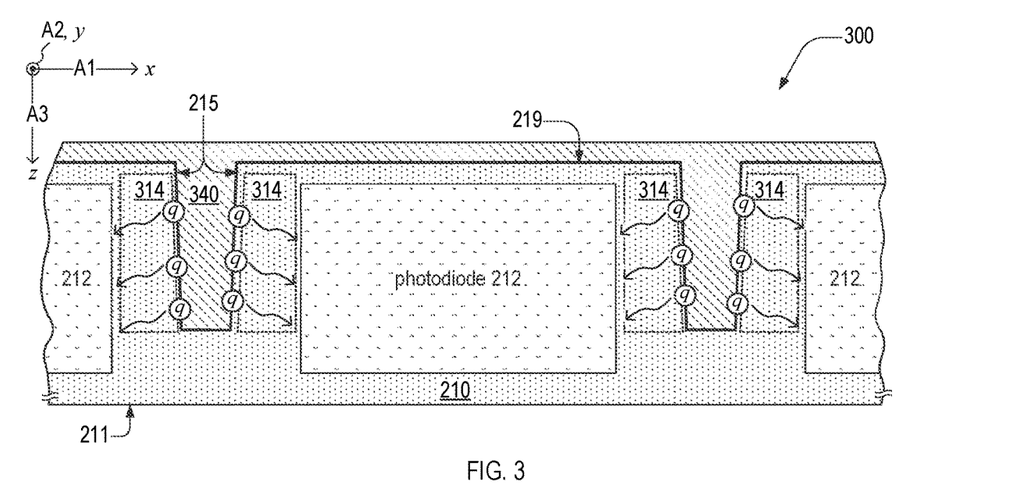
FIG. 3 is a cross-sectional schematic of an image sensor, which is an example of the image sensor of FIG. 1.

Herein, the x-y plane is formed by orthogonal axes A1 and A2, and planes parallel to the x-y plane are referred to as transverse planes. Unless otherwise specified, heights and depths of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the x or y axis respectively, and a vertical direction is along the z axis. FIGS. 2 and 3 are best viewed together in the following description.

Image sensor 200 includes a semiconductor substrate 210. Semiconductor substrate 210 includes a front surface 211, a back surface 219 opposite the front surface, a photodiode 212, and a concave surface 215. Concave surface 215 is between front surface 211 and the back surface 219, extends from back surface 219 toward front surface 211, and defines a trench 215T. Semiconductor substrate 210 has a thickness 218 between surfaces 211 and 219. In embodiments thickness 218 is between two micrometers and seven micrometers. In embodiments, thickness 218 is between two to four micrometers, for example, when image sensor 200 used in mobile, automobile or medical related application. In embodiments, when image sensor used for infrared sensing such as security imaging application, thickness 218 is at least three micrometers, and may exceed seven micrometers because infrared light penetrates deeper into silicon than does visible light.

In embodiments, image sensor 200 includes a passivation layer 230 on concave surface 215 and back surface 219. Layer 230 hence lines trench 215T. In embodiments, layer 230 is formed of two or more high-κ dielectric layers, where each high-κ dielectric layer has a dielectric constant $\kappa_{230}$ that exceeds that of silicon dioxide (κ=3.9). In embodiments, dielectric constant $\kappa_{230}$ exceeds the dielectric constant of silicon nitride (K=7). In an example, layer 230 is a stack of high-κ dielectric layers of aluminum oxide ($Al_2O_3$) and hafnium oxide ($HfO_2$). In examples, layer 230 is a stack of high-κ dielectric layers of tantalum oxide ($Ta_2O_5$), aluminum oxide ($Al_2O_3$) and hafnium oxide ($HfO_2$).

In embodiments, image sensor 200 includes a pinning layer 213 that has a conductive type opposite to that of photodiode 212; in such embodiments, photodiode 212 is a pinned photodiode. Pinning layer 213 may be a region of semiconductor substrate 210. When photodiode 212 is an n-type semiconductor (n-doped), pinning layer 213 is a p-type semiconductor (p-doped), and vice versa. Pinning layer 213 is adjacent to photodiode 212 and between photodiode 212 and front surface 211. Pinning layer 213 may span a region of semiconductor substrate 210 between front surface 211 and photodiode 212. Pinning layer 213 may be connected to an electrical ground.

FIG. 3 is a cross-sectional schematic of an image sensor 300, which is image sensor 200 with the addition of a dielectric layer 340 on back surface 219. Dielectric layer 340 at least partially fills trench 215T, and may also be disposed on at least part of back surface 219. Dielectric layer 340 may have a refractive index $n_{340}$ that is lower than a refractive index $n_{210}$ of semiconductor substrate 210. Dielectric layer 340 may be formed of an oxide, such as silicon dioxide.

Trench 215T may be formed via an etching process, which damages crystal lattice of semiconductor substrate 210 and results in defect or trap sites on concave surface 215. During operation of image sensor 300, charge carriers are generated at concave surface 215 (e.g., an interface between dielectric layer 340 and semiconductor substrate 210). The charge carriers, denoted by an encircled q in FIG. 3, diffuse toward photodiode 212 as dark current, which results in white pixel defects. FIG. 3 denotes a substrate region 314 of semiconductor substrate 210 between photodiode 212 and concave surface 215. When substrate region 314 is a p-type semiconductor region (and photodiode 212 is n-type), charge carriers q are electrons, and are minority carriers in substrate region 314. When substrate region 314 is an n-type semiconductor region (and photodiode 212 is p-type), charge carriers q denote holes, and are minority carriers in substrate region 314.

In embodiments, image sensor 300 includes passivation layer 230 between semiconductor substrate 210 and dielectric layer 340. That is, passivation layer 230 is on surfaces 219 and 215, and dielectric layer 340 is on passivation layer 230. Passivation layer 230 contains negative fixed charges that form a hole accumulation region around concave surface 215 and reduces carrier diffusion from surface 215 to photodiode 212, but may not eliminate such diffusion, and resultant white pixel defects.

Figure 4:
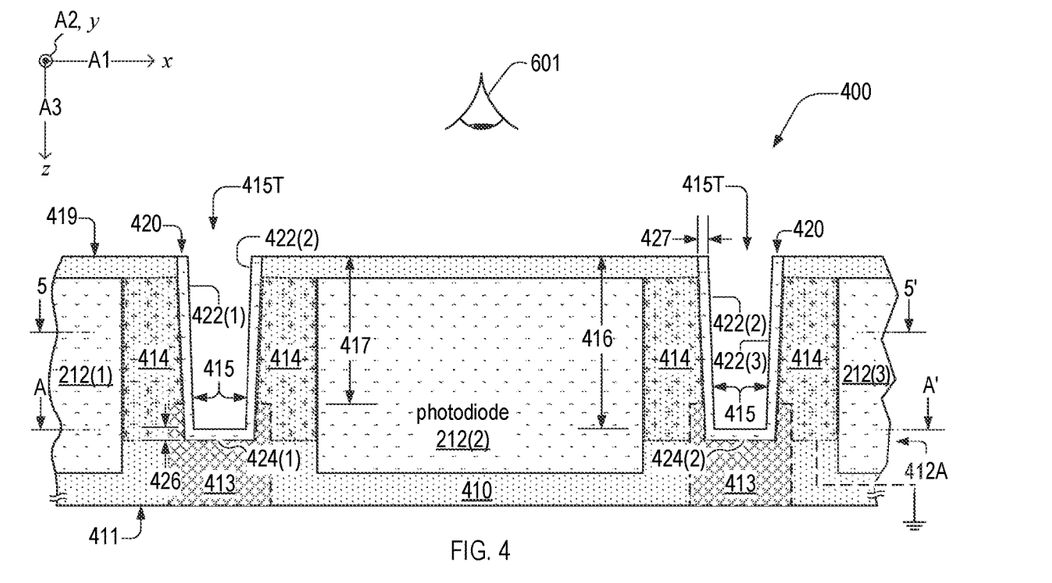
FIGS. 4 and 5 are respective cross-sectional schematic of a dark-current-inhibiting image sensor, which is third embodiment of the image sensor of FIG. 1.
Figure 5:
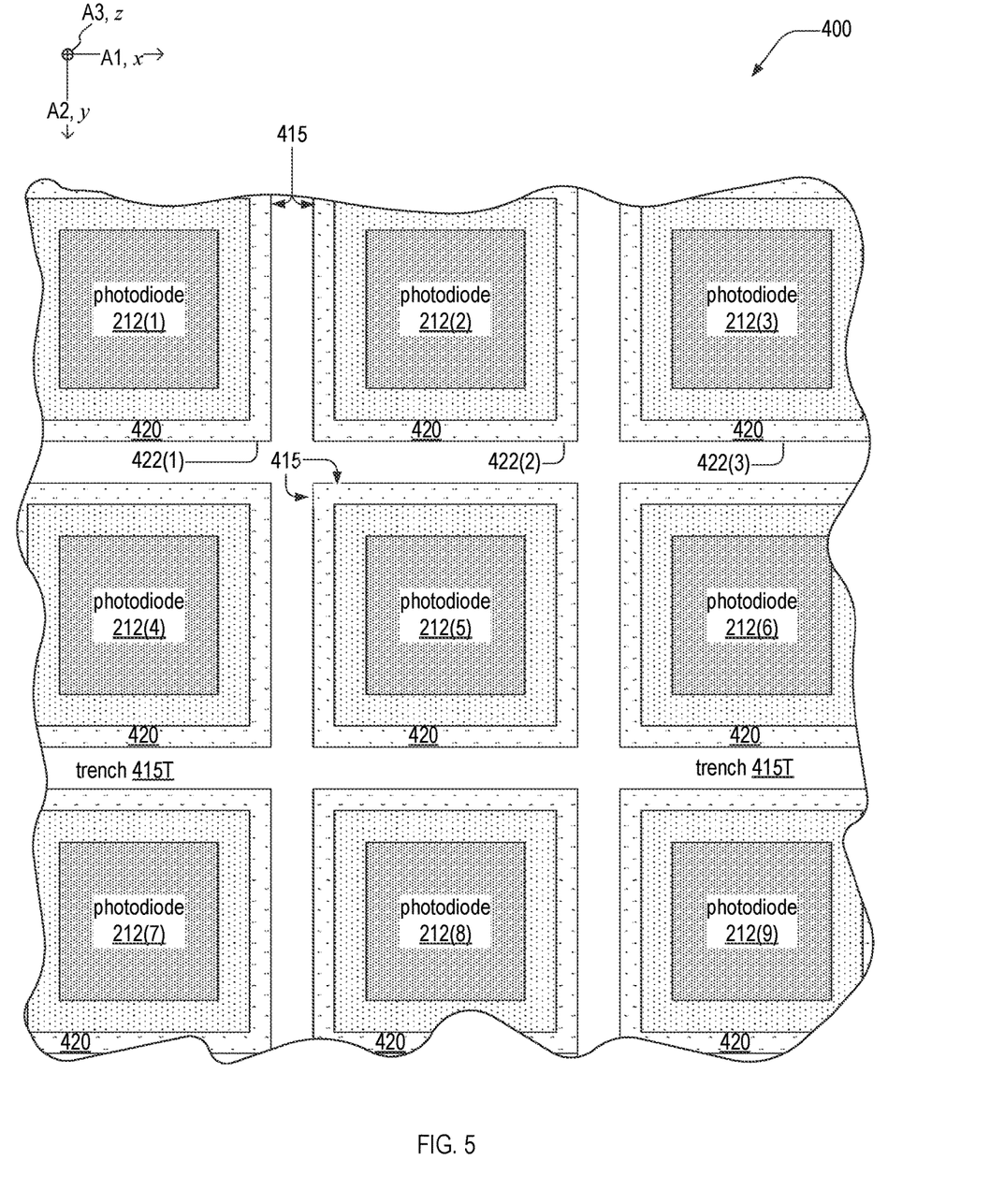

FIGS. 4 and 5 are respective cross-sectional schematics of a dark-current-inhibiting image sensor 400, herein after image sensor 400, which is an example of image sensor 200. Image sensor 400 includes a thin junction 420 that extends from trench-defining surfaces into a semiconductor substrate 410 of image sensor 400. Thin junction 420 further reduces dark current and white pixel defects. While the cross-sectional views of each of FIGS. 2-4 are shown in the x-z plane, they are also representative of respective image sensors 200, 300, and 400 in a plane parallel to the y-z plane.

FIG. 4 denotes a horizontal cross-sectional plane 5-5', which is the cross-sectional plane of FIG. 5. In cross-sectional plane 5-5', trench 415T surrounds photodiode 212. In embodiments, cross-sectional plane 5-5' is parallel to back surface 419.

Semiconductor substrate 410 is an example of semiconductor substrate 210. Semiconductor substrate 410 includes a front surface 411, a concave surface 415, and a back surface 419, which are examples of respective surfaces 211, 215, and 219 of semiconductor substrate 210. Concave surface 415 defines a trench 415T, which is an example of trench 215T. In a plane that intersects photodiode 212 and is parallel to either the x-y plane or the y-z plane, concave surface 415 includes two concave sections, as shown in FIG. 4.

In embodiments, image sensor 400 includes at least one of pinning layer 213, passivation layer 230, and dielectric layer 340. Passivation layer 230 may be on surfaces 415 and 419. Dielectric layer 340 may be on surfaces 415 and 419, or on passivation layer 230. Dielectric layer 340 may partially or entirely fill trench 415T. For clarity of illustration, none of layers 213, 230, and 340 are shown in FIG. 4.

In embodiments, image sensor 400 is a backside illuminated image sensor, hence front surface 411 may be referred to as a non-illuminated surface, and back surface 419 may be referred to as illuminated surface. In some embodiments, image sensor 400 may be a rolling shutter image sensor or global shutter image sensor.

Thin junction 420 extends from concave surface 415 to a vertical depth 426 and a horizontal depth 427 within semiconductor substrate 410 with respect to concave surface 415. Thin junction 420 may be part of semiconductor substrate 410, and concave surface 415 may be a junction surface of thin junction 420.

Each of depths 426 and 427 may be between twenty nanometers and fifty nanometers, and depth 426 may differ from depth 427 depending on the trench width of trench 415T. In embodiments, thin junction 420 is extends uniformly from concave surface 415 in directions A1 and A3 such that depth 426 is the same as depth 427. In embodiments, the ion concentration of thin junction 420 is between $10^{18}$ and $10^{21}$ ions per cubic centimeter.

Semiconductor substrate 410 includes a substrate region 414 located between thin junction 420 and photodiode 212. In embodiments, charge carriers q are minority carriers in substrate region 414, and become majority carriers when in thin junction 420. To facilitate discharge of charge carriers q away from photodiode 212, thin junction 420 may be connected to a ground or a voltage source through a biasing line to receive a biasing voltage and substrate region 414 may be connected to an electrical ground.

In embodiments, the ion concentration $n_{420}$ of thin junction 420 is greater than the ion concentration $n_{414}$ of substrate region 414. This relative concentration may result from the doping process, e.g., plasma immersion, where dopant concentration decreases as a function of distance from surface 415. Also, when $n_{420}$ is too low, e.g., lower than ion concentration $n_{414}$, the depletion region associated with thin junction 420 expands to a junction surface near surface 415. This results in charge depletion thin junction 415's surface region as, contra the purpose of thin junction 420, such charges would not be able to be drain out due to high resistance. That is, thin junction 415 needs to have a minimum level of doping to prevent its surface from being depleted of charge, thereby allowing charge to be drained out during biasing operation. As ion concentration $n_{414}$ increases to become comparable to or greater than ion concentration $n_{420}$, the depletion region of substrate region 414 narrows and the associated electric field may become too high which could lead to junction breakdown.

In embodiments, the ion concentration $n_{420}$ of thin junction 420 is on the same order of magnitude as the ion concentration $n_{212}$ of photodiode 212, such that a ratio of the two concentrations ($n_{212}/n_{420}$ or $n_{420}/n_{212}$) is between one-tenth and ten. Ion concentration $n_{212}$ may exceed ion concentration $n_{420}$, which prevents negative impacts of the full-well capacity of photodiode 212.

Substrate region 414 is a semiconductor substrate region of a first conductive type. Each of photodiode 212 and thin junction 420 is a semiconductor substrate region of a second conductive type opposite the first conductive type. For example, when substrate region 414 is a p-type semiconductor region, each of photodiode 212 and thin junction 420 is an n-type semiconductor region, and photodiode 212, substrate region 414, and thin junction 420 form an NPN junction. The NPN junction enables majority carriers at thin junction 420 and/or concave surface 415 of trench 415T be discharged through a connecting biasing line, and minority carrier electrons in substrate region 414 to diffuse to nearby photodiode 212 or thin junction 420. Similarly, when substrate region 414 is an n-type semiconductor region, each of photodiode 212 and thin junction 420 is a p-type semiconductor region, and photodiode 212, substrate region 414, and thin junction 420 form a PNP junction. The PNP junction enables minority carrier holes in substrate region 414 to diffuse to nearby photodiode 212 or thin junction 420.

In embodiments, thin junction 420 is spaced at a distance from a respective photodiode 212 along direction A1 and A2, where the distance ranges from 50 nanometers to 200 nanometers depending on associated pixel size. For example, each of the lateral width of substrate region 414 along direction A1 and the lateral width of substrate region 414 along direction A2 ranges from 50 nanometers to 200 nanometers. In embodiments, the respective lateral widths of substrate region 414 along directions A1 and A2 are equal.

In embodiments, substrate region 414 extends to at least one of the following regions: beneath trench 415T, between photodiode 212 and front surface 411, and between photodiode 212 and back surface 419. In embodiments, substrate region 414 refers to all regions of semiconductor substrate 410 other than photodiodes 212 and thin junction 420.

Thin junction 420 may be formed via ion implantation of concave surface 415 through back surface 419. For example, a plasma immersion ion implantation process (e.g., with arsenic implantation) and laser annealing at low temperature (e.g., room temperature) and high energy may be used to form thin junction 420. The ion implantation dosage may be between $10^{13}$ and $10^{14}$ ions per square centimeter. Alternatively, thin junction 420 may be epitaxially grown on concave surface 415.

In embodiments, image sensor 400 includes an isolation well 413 that is implanted from front surface 411 and surrounds photodiode 212 in a cross-sectional plane A-A'. Trench 415T has a depth 416 with respect to back surface 419. Isolation well 413 extends from front surface 411 to a depth that is at a distance 417 from back surface 419. In embodiments, and as illustrated in FIG. 4, depth 416 exceeds distance 417 and concave surface 415 is partially disposed in isolation well 413. In embodiments, distance 417 exceeds depth 416, such that isolation well 413 is spatially separated from, and hence not immediately adjacent to, thin junction 420.

Isolation well 413 and substrate region 414 have the same conductive type. In embodiments, isolation well 413's ion concentration exceeds that of substrate region 414. In embodiments, substrate region 414 refers to all regions of semiconductor substrate 410 other than photodiodes 212, thin junction 420, and isolation wells 413.

Semiconductor substrate 410 includes a plurality of photodiodes 212, including photodiodes 212(1-3) denoted in FIGS. 4 and 5. Photodiodes 212 form a photodiode array 212A, which may be part of pixel array 112A. Back surface 419 may include a plurality of additional concave surfaces 415 each defining a respective one of a plurality of additional trenches 415T. Each trench 415T surrounds a respective photodiode 212 and isolates the respective photodiode 212 from adjacent photodiodes 212. Each trench 415T has a cross-sectional shape in the x-y plane; the shape may be square, circular, elliptical, rectangular, or more generally polygonal shape. The cross-sectional shape of trench 415T in the x-y plane may depend on the shape of photodiode and/or pixel array arrangement. As illustrated in FIG. 5, trenches 415T form an interconnected array of trenches. In embodiments, this array of trenches 415T forms a single grid-shaped trench.

FIGS. 4 and 5 illustrate junction-sidewall regions 422(1-3) and junction bottom regions 424(1) and 424(2) of junction 420. Each junction-sidewall region 422(1-3) surrounds photodiode 212(1-3) respectively. Junction bottom region 424(1) connects junction-sidewall regions 422(1) and 422(2), while junction-bottom region 424(2) connects junction-sidewall regions 422(2) and 422(3). Hence, while each junction-sidewall region 422 appears to be distinct from an adjacent junction-sidewall region 422, each junction-sidewall region 422 is part of a continuous thin junction 420 that forms a grid in semiconductor substrate 410. Accordingly, thin junction 420 may surround multiple photodiodes, e.g., all photodiodes of image sensor 400, and may be connected to, and held at, a common voltage.

Photodiodes 212 and thin junctions 420 form a plurality of pixels of a pixel array 412A of image sensor 400. Pixel array 412A is an example of pixel array 112A, FIG. 1. When image sensor 400 includes other previously introduced elements, such as passivation layer 230 and dielectric layer 340, these elements may be viewed as part of pixel array 412A, and/or part of a pixel array region of image sensor 400. In some embodiments, a pixel pitch of pixel array 412A is between 0.7 micrometers to 3 micrometers.

Figure 6:
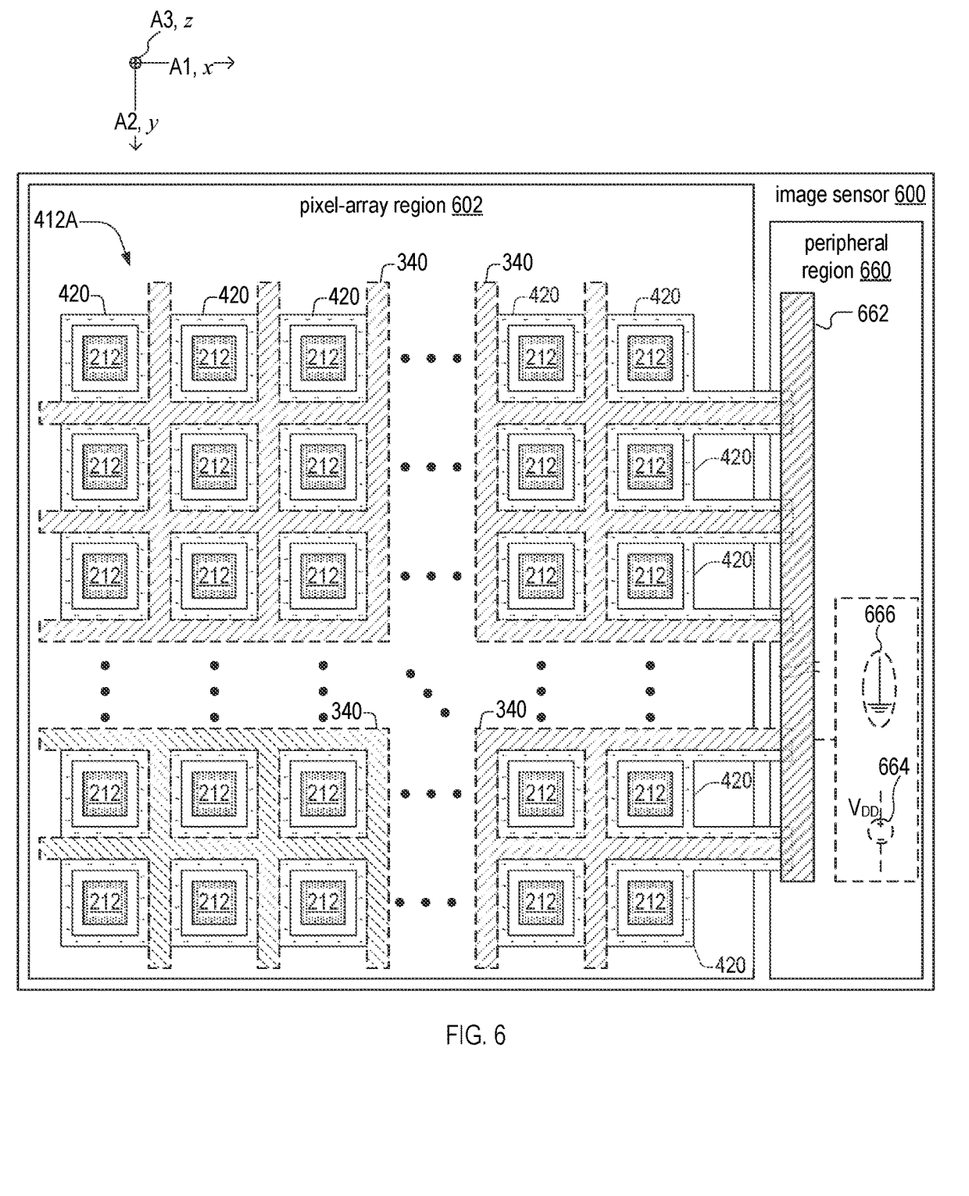
FIG. 6 is a plan view of a dark-current-inhibiting image sensor, which is an embodiment of the image sensor of FIGS. 4 and 5.

FIG. 6 is a schematic plan view of a dark-current-inhibiting image sensor 600, which is an example of image sensor 400. The plan view of FIG. 6 is from a viewpoint 601 above semiconductor substrate 410 and facing the positive z direction such that back surface 419 of semiconductor substrate 410, FIG. 4, is visible. Image sensor 600 includes a pixel-array region 602 and a peripheral region 660 adjacent to pixel-array region 602 and on back surface 419. In embodiments, peripheral region 660 surrounds pixel-array region 602. Pixel-array region 602 includes dielectric layer 340 and pixel array 412A, and thin junction 420. FIG. 6 includes callouts directed to different sections of thin junction 420. FIG. 6 also illustrates locations photodiodes 212 beneath back surface 419.

Peripheral region 660 includes at least one conductive contact 662 that is electrically connected to thin junction 420, which may form a continuous grid. In embodiments, parts of dielectric layer 340 and junction 420 that extend into peripheral region 660 are between one conductive contact 662 and front surface 411. Conductive contact 662 may be on back surface 419.

In embodiments, conductive contact 662 is held either at electrical ground or at a bias voltage $V_{DD}$, such that charge carriers q are discharged to conductive contact 662 (and, in embodiments, to a biasing line connected thereto) instead of diffusing to one of adjacent photodiodes 212. Bias voltage $V_{DD}$ is positive when thin junction 420 is an n-type semiconductor, and is negative when thin junction 420 is a p-type semiconductor. The voltage magnitude $|V_{DD}|$ of bias voltage $V_{DD}$ may be between 0.1 volt and one volt, and may temporally vary between these values depending on the electrical field strength required to pull electrons formed at sidewalls of trenches 415T (surface 415) away from photodiode 212 and discharged to conductive contact 662 without affecting full well capacity of photodiode 212. In some embodiments, the upper limit of basing voltage $V_{DD}$ is configured based on (e.g., is an increasing function of) a pinning voltage level $V_{pin}$ of photodiode 212. That is, higher basing voltage $V_{DD}$ (e.g., voltage magnitude $|V_{DD}|$ of bias voltage $V_{DD}$ exceeding one volt) may be applied for higher pinning voltage level $V_{pin}$. In embodiments, conductive contact 662 is connected to one of a voltage source 664 and an electrical ground 666, at least one of which may be part of image sensor 600.

In embodiments, image sensor 600 may have a stack chip structure where at least one of voltage source 664 and electrical ground 666 is located in a logic chip, and pixel array 412A, including photodiodes 212, trenches 415T, and thin junction 420, is located on an image sensor chip. The thin junction 420 may be connected to the voltage source 664 and the electrical ground 666 through vertical conductor structure e.g. by through silicon vias or through substrate vias.

Figure 7:
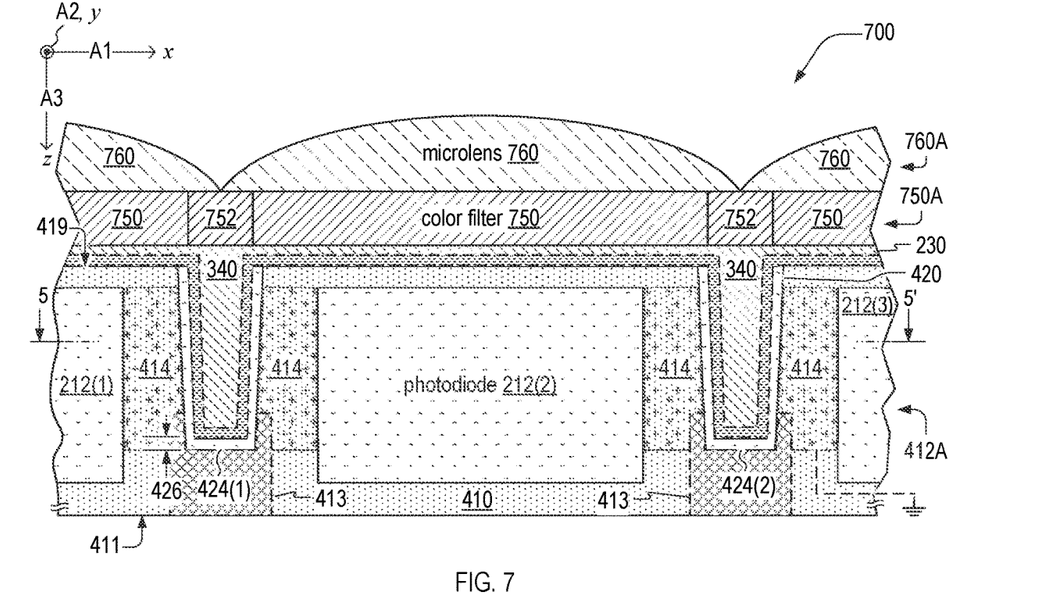
FIG. 7 is a schematic of a dark-current-inhibiting image sensor, which is an embodiment of the image sensor of FIGS. 4 and 5.

FIG. 7 is a schematic cross-sectional view of a dark-current-inhibiting image sensor 700, which is image sensor 400 with the addition of a metal grid 752, a color filter array 750A, and a microlens array 760A. Image sensor 700 includes passivation layer 230 and dielectric layer 340. Metal grid 752 is aligned to trenches 415T. Color filter array 750A includes a plurality of color filters 750, each of which aligned to a respective photodiode 212 and within an aperture of metal grid 752. Each color filter 750 may be one of a red, blue, green, cyan, magenta, yellow, infrared, or panchromatic color filter. Microlens array 760A includes a plurality of microlenses 760, each of which is disposed on a respective color filter 750.

Figure 8:
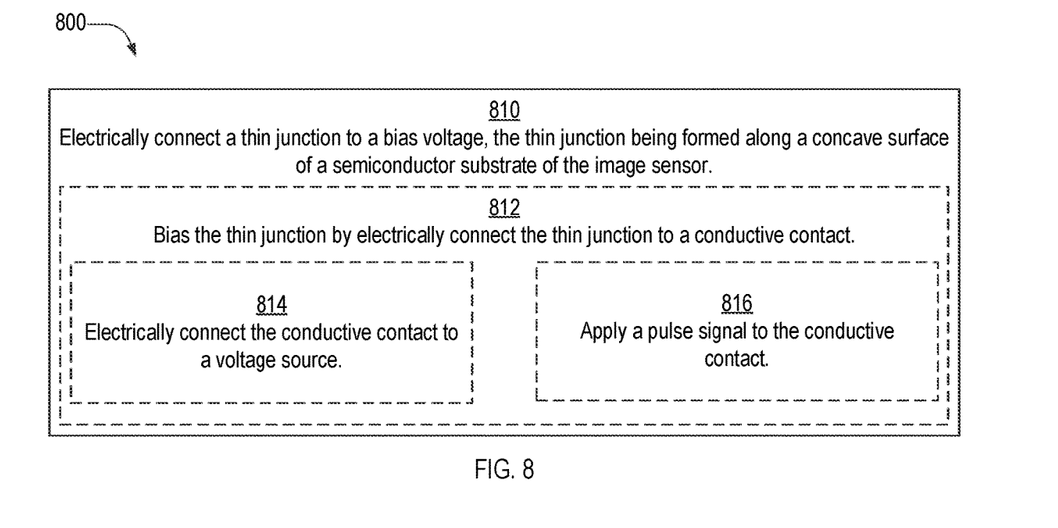
FIG. 8 is a flowchart illustrating a method for inhibiting dark current in an image sensor, in an embodiment.

FIG. 8 is a flowchart illustrating a method 800 for inhibiting dark current in an image sensor. Method 800 may be implemented by any one of image sensors 400, 600, and 700. Method 800 includes step 810, which may include step 812. Step 812 may also include step 814.

Step 810 includes electrically connecting a thin junction to a bias voltage. The thin junction is formed along a concave surface of a semiconductor substrate of the image sensor. The concave surface forms a trench surrounding a photodiode of the semiconductor substrate. The thin junction and a region of the semiconductor substrate adjacent thereto have opposite conductive types. In an example of step 810, thin junction 420 of image sensor 400 is electrically connected to an a bias voltage, which may be an electrical ground or a non-zero bias voltage.

When the semiconductor substrate includes a photodiode array and a peripheral region adjacent to photodiode array, method 800 may include step 812. Step 812 includes biasing the thin junction by electrically connecting the thin junction to a conductive contact that is (i) located in the peripheral region and (ii) either electrically connected to an electrical ground or held at a non-zero voltage to provide the biasing voltage to the thin junction. An amplitude of bias voltage may be non-zero, for example, between 0.1 V and 1 V. In an example of step 812, thin junction 420 of image sensor 600, FIG. 6, is electrically connected to conductive contact 662.

Step 814 includes electrically connecting the conductive contact to a voltage source to (i) bias the thin junction and (ii) drain charge carriers proximate to the concave surface to the voltage source through the conductive contact. In an example of step 814, conductive contact 662 is electrically connected to voltage source 664, which biases thin junction 420.

In embodiments, the image sensor is a global shutter image sensor, and image charges are simultaneously transferred from all photodiodes of a pixel array to corresponding storage nodes after integration. In such embodiments, step 812 may include step 816. Step 816 includes applying a pulse signal to the thin junction through the conductive contact. In an example of step 816, thin junction 420 is biased by applying a pulse signal to conductive contact 662, and hence also to thin junction 420. In some embodiments, the pulse signal has (i) a non-zero voltage amplitude (e.g., 0.1V to 1V) during each integration period of the image sensor, and (ii) a zero voltage amplitude at times other than the integration period. In embodiments, the non-zero voltage amplitude is configured based on a pinning voltage level $V_{pin}$ of the photodiode.

In embodiments, the polarity of either the non-zero bias voltage or non-zero voltage amplitude of the pulse signal is based on the conductive type of the thin junction 420. The polarity may be positive when thin junction 420 is n-type doped region. The polarity may be negative when thin junction 420 is of p-type doped region.

Combinations of Features (A1) A dark-current-inhibiting image sensor includes a semiconductor substrate, a thin and a thin junction. The semiconductor substrate includes a front surface, a back surface opposite the front surface, a photodiode, and a concave surface between the front surface and the back surface. The concave surface extends from the back surface toward the front surface, and defines a trench that surrounds the photodiode in a cross-sectional plane parallel to the back surface. The thin junction extends from the concave surface into the semiconductor substrate, and is a region of the semiconductor substrate. The semiconductor substrate includes a first substrate region, located between the thin junction and the photodiode, that has a first conductive type. The photodiode and the thin junction have a second conductive type opposite the first conductive type.

(A2) In embodiments of image sensor (A1), in any cross-section parallel to the back surface and between the back surface and a depth of the trench, the thin junction surrounds the photodiode.

(A3) In embodiments of either one of image sensors (A1) and (A2), a thickness of the thin junction is between twenty nanometers and fifty nanometers.

(A4) In embodiments of any one of image sensors (A1)-(A3), an ion concentration of the thin junction is greater than an ion concentration of the semiconductor substrate.

(A5) Embodiments of any one of image sensors (A1)-(A4) further include a dielectric layer on the back surface and at least partially filling the trench.

(A6) Embodiments of any one of image sensors (A1)-(A5) further include a high-κ dielectric layer lining the trench and covering the back surface. The high-κ dielectric layer has a dielectric constant greater than or equal to that of silicon dioxide.

(A7) Embodiments of any one of image sensors (A1)-(A6) further include an isolation well that surrounds the photodiode in a cross-section parallel to the front surface. A depth of the isolation well exceeds a depth of the trench with respect to the back surface.

(A8) Embodiments of any one of image sensors (A1)-(A6) further include an isolation well that surrounds the photodiode in a cross-section parallel to the front surface. A depth of the isolation well is less than a depth of the trench with respect to the back surface.

(A9) In embodiments of any one of image sensors (A7) and (A8), the isolation well has the first conductive type and has an ion concentration that exceeds that of the first substrate region.

(A10) In embodiments of any one of image sensors (A1)-(A9), the semiconductor substrate further includes: (i) a plurality of additional photodiodes that, with the photodiode, form a photodiode array; and (ii) a peripheral region adjacent to the photodiode array that includes a conductive contact electrically connected to the thin junction.

(A11) Embodiments of image sensor (A10) further include one of a voltage source and an electrical ground electrically connected to the conductive contact.

(A12) Embodiments of any one of image sensors (A1)-(A11) further include, between the front surface and the back surface, a plurality of additional concave surfaces and a plurality of additional thin junctions. Each of the plurality of additional concave surfaces defines a respective one of a plurality of additional trenches each surrounding a respective one of the plurality of additional photodiodes. The trench and the plurality of additional trenches form an interconnected array of trenches. Each of the plurality of additional thin junctions of the second conductive type extends from a respective one of the plurality of additional concave surfaces into the semiconductor substrate. The thin junction and the plurality of additional thin junctions form a thin-junction-grid that is electrically connected to the conductive contact.

(A13) In embodiments of image sensor (A12), for each additional photodiode, additional trench, and additional thin junctions of the plurality of additional photodiodes, trenches, and thin junctions respectively: in any cross-section between the back surface and a depth of the additional trench, the additional thin junction surrounds the photodiode.

(A14) In embodiments of either one of image sensors (A12) and (A13), for each additional photodiode, additional trench, and additional thin junctions of the plurality of additional photodiodes, trenches, and thin junctions respectively: the semiconductor substrate includes a second substrate region, located between the additional thin junction and the additional photodiode, having the first conductive type. The additional photodiode and the additional thin junction have the second conductive type.

(A15) In embodiments of any one of image sensors (A1)-(A14), a ratio of (i) an ion concentration of the thin junction to (ii) an ion concentration of the photodiode being between one-tenth and ten.

(B1) A method for inhibiting dark current in an image sensor includes electrically connecting a thin junction to a bias voltage. The thin junction is formed along a concave surface of a semiconductor substrate of the image sensor. The concave surface forms a trench surrounding a photodiode of the semiconductor substrate. The thin junction and a region of the semiconductor substrate adjacent thereto have opposite conductive types.

(B2) In embodiments of method (B1), the semiconductor substrate includes a photodiode array and a peripheral region thereto. In such embodiments, said step of electrically connecting may include biasing the thin junction by electrically connecting the thin junction to a conductive contact that is (i) located in the peripheral region and (ii) either electrically connected to an electrical ground or held at a non-zero voltage to provide the biasing voltage to the thin junction.

(B3) In embodiments of method (B2), said biasing includes electrically connecting the conductive contact to a voltage source to (i) bias the thin junction and (ii) drain charge carriers proximate to the concave surface to the voltage source through the conductive contact.

(B4) In embodiments of either of methods (B2) and (B3), said biasing includes applying a pulse signal to the thin junction through the conductive contact. The pulse signal has (i) a non-zero voltage amplitude during each integration period of the image sensor, and (ii) a zero voltage amplitude at times other than the integration period. The non-zero voltage amplitude has a same polarity as the bias voltage.

(B5) In embodiments of any of methods (B1)-(B4), an absolute value of the non-zero voltage amplitude is between 0.1 volt and one volt.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A dark-current-inhibiting image sensor comprising:
   a semiconductor substrate that includes a front surface, a back surface opposite the front surface, a photodiode, and a concave surface between the front surface and the back surface, extending from the back surface toward the front surface, and defining a trench that surrounds the photodiode in a cross-sectional plane parallel to the back surface; and
   a thin junction extending from the concave surface into the semiconductor substrate, and being a region of the semiconductor substrate,
   the semiconductor substrate including a first substrate region, located between the thin junction and the photodiode, having a first conductive type,
   the photodiode and the thin junction having a second conductive type opposite the first conductive type.

2. The image sensor of claim 1, in any cross-section parallel to the back surface and between the back surface and a depth of the trench, the thin junction surrounds the photodiode.

3. The image sensor of claim 1, a thickness of the thin junction being between twenty nanometers and fifty nanometers.

4. The image sensor of claim 1, an ion concentration of the thin junction being greater than an ion concentration of the semiconductor substrate.

5. The image sensor of claim 1, further comprising a high-k dielectric layer lining the trench and covering the back surface, the high-k dielectric layer having a dielectric constant greater than or equal to that of silicon dioxide.

6. The image sensor of claim 1, further comprising an isolation well that surrounds the photodiode in a cross-section parallel to the front surface, a depth of the isolation well exceeding a depth of the trench with respect to the back surface.

7. The image sensor of claim 1, further comprising an isolation well that surrounds the photodiode in a cross-section parallel to the front surface, a depth of the isolation well being less than a depth of the trench with respect to the back surface.

8. The image sensor of claim 7, the isolation well having the first conductive type and having an ion concentration that exceeds that of the first substrate region.

9. The image sensor of claim 1, the semiconductor substrate further comprising:
   a plurality of additional photodiodes that, with the photodiode, form a photodiode array; and
   a peripheral region adjacent to the photodiode array that includes a conductive contact electrically connected to the thin junction.

10. The image sensor of claim 9, further comprising one of a voltage source and an electrical ground electrically connected to the conductive contact.

11. The image sensor of claim 9, further comprising, between the front surface and the back surface:
    a plurality of additional concave surfaces each defining a respective one of a plurality of additional trenches each surrounding a respective one of the plurality of additional photodiodes, the trench and the plurality of additional trenches forming an interconnected array of trenches; and
    a plurality of additional thin junctions of the second conductive type each extending from a respective one of the plurality of additional concave surfaces into the semiconductor substrate, the thin junction and the plurality of additional thin junctions forming a thin-junction-grid that is electrically connected to the conductive contact.

12. The image sensor of claim 11, for each additional photodiode, additional trench, and additional thin junctions of the plurality of additional photodiodes, trenches, and thin junctions respectively:
    in any cross-section between the back surface and a depth of the additional trench, the additional thin junction surrounds the photodiode.

13. The image sensor of claim 11, for each additional photodiode, additional trench, and additional thin junctions of the plurality of additional photodiodes, trenches, and thin junctions respectively:
    the semiconductor substrate including a second substrate region, located between the additional thin junction and the additional photodiode, having the first conductive type,
    the additional photodiode and the additional thin junction having the second conductive type.

14. The image sensor of claim 1, a ratio of (i) an ion concentration of the thin junction to (ii) an ion concentration of the photodiode being between one-tenth and ten.

15. A method for inhibiting dark current in an image sensor, the method comprising:
    forming, in a semiconductor substrate that includes a photodiode formed therein, a trench that surrounds the photodiode, the trench being defined by a concave surface of the semiconductor substrate; and
    forming a thin junction along the concave surface, the thin junction and a region of the semiconductor substrate adjacent thereto having opposite conductive types; and
    electrically connecting the thin junction to a bias voltage.

16. The method of claim 15, the semiconductor substrate including (i) a photodiode array that includes the photodiode and (ii) a peripheral region adjacent to the photodiode array, electrically connecting comprising:
    biasing the thin junction by electrically connecting the thin junction to a conductive contact that is (i) located in the peripheral region and (ii) either electrically connected to an electrical ground or held at a non-zero voltage to provide the biasing voltage to the thin junction.

17. The method of claim 16, said biasing comprising:
    electrically connecting the conductive contact to a voltage source to (i) bias the thin junction and (ii) drain charge carriers proximate to the concave surface to the voltage source through the conductive contact.

18. The method of claim 16, said biasing comprising:
    applying a pulse signal to the thin junction through the conductive contact, the pulse signal having (i) a non-zero voltage amplitude during each integration period of the image sensor, and (ii) a zero voltage amplitude at times other than the integration period, the non-zero voltage amplitude having a same polarity as the bias voltage.

19. The method of claim 16, the non-zero voltage being (b) positive when each of the photodiode and the thin junction is n-doped, and (b) negative when each of the photodiode and the thin junction is p-doped.

20. A dark-current-inhibiting image sensor comprising:
    a semiconductor substrate that includes a front surface, a back surface opposite the front surface, a photodiode, and a concave surface between the front surface and the back surface, extending from the back surface toward the front surface, and defining a trench that surrounds the photodiode in a cross-sectional plane parallel to the back surface; and a thin junction extending from the concave surface into the semiconductor substrate, and being a region of the semiconductor substrate, an ion concentration of the thin junction being greater than an ion concentration of the semiconductor substrate, the semiconductor substrate including a first substrate region, located between the thin junction and the photodiode, having a first conductive type, the photodiode and the thin junction having a second conductive type opposite the first conductive type.

* * * * *